United States Patent

Takaoku et al.

Patent Number: 5,847,559
Date of Patent: Dec. 8, 1998

[54] SPECTRUM ANALYZER

[75] Inventors: Hiroaki Takaoku, Kumagaya; Takayoshi Fukui, Hamura, both of Japan

[73] Assignee: Advantest Corp., Tokyo, Japan

[21] Appl. No.: 704,622

[22] PCT Filed: Jan. 23, 1996

[86] PCT No.: PCT/JP96/00115

§ 371 Date: Dec. 23, 1996

§ 102(e) Date: Dec. 23, 1996

[87] PCT Pub. No.: WO96/23231

PCT Pub. Date: Aug. 1, 1996

[30] Foreign Application Priority Data

Jan. 24, 1995 [JP] Japan .................................. 7-027444

[51] Int. Cl.⁶ .................................................. G01R 27/26
[52] U.S. Cl. ................. 324/76.27; 455/67.1; 324/76.23; 702/66
[58] Field of Search .................... 324/76.19, 76.2, 324/76.23, 76.24, 76.27; 364/484; 455/67.1

[56] References Cited

U.S. PATENT DOCUMENTS

| 4,581,767 | 4/1986 | Monsen | 324/76.24 |
| 4,678,345 | 7/1987 | Agosten | 324/76.24 |
| 4,795,970 | 1/1989 | Owen | 324/76.23 |
| 4,799,020 | 1/1989 | English | 324/76.23 |
| 4,998,217 | 3/1991 | Holcomb | 364/573 |

FOREIGN PATENT DOCUMENTS

| 62-129813 | 2/1986 | Japan . |
| 4-357470 | 2/1991 | Japan . |
| 6-33085 | 2/1991 | Japan . |
| 7-209351 | 1/1994 | Japan . |

Primary Examiner—Maura Regan
Attorney, Agent, or Firm—Muramatsu & Associates

[57] ABSTRACT

An improved local oscillator for use in a digital step sweep is capable of minimizing dynamic spurious which is an inverse of the unit step time $T_{step}$. The local oscillator includes a random clock delay 12 which provides a random clock $12_{rndclk}$ to the DDS 40 to modify a time length of the unit step time $T_{step}$ for sweeping the local oscillator to be random.

5 Claims, 4 Drawing Sheets

SPECTRUM ANALYZER

TECHNICAL FIELD

This invention relates to a local oscillator to be used in a spectrum analyzer, and more particularly, to a local oscillator which reduces dynamic spurious caused by a digital step sweep of the local oscillator.

BACKGROUND ART

An example of conventional spectrum analyzer utilizes a local oscillator whose frequency is digitally controlled by a step sweep signal through a direct digital synthesizer (DDS) technology. This example is explained with reference to FIGS. 4, 5 and 6.

This analyzer is formed of, as shown in FIG. 4, a frequency converter 50, a detector 62, display arithmetic unit 64, and a display 68.

The frequency converter 50, as used as a frequency converter in an ordinary spectrum analyzer, receives a input signal 100 to be analyzed and converts the input signal to an intermediate frequency signal when a local oscillator sweeps its frequency for selected frequency ranges. The intermediate frequency signal is filtered by a BFP (band pass filter) to a predetermined band width and is then provided to the detector 62. The frequency converter 50 includes an ATT (attenuator) 51, mixers 52 and 53, a local oscillator 30, an oscillator 54 and a BFP 55.

The local oscillator 30 is an oscillator which can sweep a desired frequency range in a digital step manner with the use of DDS. As shown in FIG. 5, the local oscillator 30 includes a DDS time base 32, a DDS 40, a DA converter 34, LPF (low pass filter) 35, a phase comparator 36, a divider 37, an integrator 38, and a YTO (YIG-tuned oscillator) 39.

The DDS time base 32 receives a reference clock 31 and sweep conditions 33 which includes a span (sweep frequency range) and a sweep time $T_{sweep}$ and delivers a clock signal $32_{clk}$ to the DDS 40. The clock signal $32_{clk}$ has a unit time step $T_{step}$ which is produced by dividing the reference clock 32 by a division factor Div, i.e., $T_{step}$=Div/(reference clock 31). Thus, one clock time period of the clock signal $32_{clk}$ is the unit time step Tstep for the step sweep of the local oscillator 30.

The DDS 40 is a synthesizer which generates a data signal indicating a desired frequency of a digital sine wave in a digital form. As shown in FIG. 6, the DDS 40 is formed of a frequency register 42, an adder 44, and a ROM table memory 46.

The frequency register 42 stores advanced phase data $42_{dat}$ and provides the phase data to one input of the adder 44. The advance phase data defines an advanced phase of a sine wave expressed by 32 bit data. By this data, as shown in a stepped ramp signal of FIG. 7(a), a unit step frequency 92 is accumulated at every unit step time $T_{step}$, which results in one sweep time $T_{sweep}$=M×$T_{step}$. Here, M is a constant number of steps in a sweep, such as M=2,048.

The adder 44 is a 32 bit accumulator to advance the unit phase of the above noted unit frequency 92 of the sine wave. At every clock signal $32_{clk}$ from the DDS time base 32, one input terminal of the adder 44 receives the advance phase data $42_{dat}$, while the other input terminal receives the data from a register $44_r$ which holds the value in the previous accumulation cycle. The adder 44 accumulates the two input data and the result is latched in the register $44_r$.

The ROM table memory 46 converts the received data to the code of step like sine waveform data. The ROM table memory 46 uses upper 10 bit data out of 32 bit data from the adder 44 as address data to read out 10 bit sine wave code data $46_{dat}$ from the table memory. The sine wave code data $46_{dat}$ is supplied to the DA converter 34 shown in FIG. 5.

The DA converter 34 in FIG. 5 converts the 10 bit sine wave code data $46_{dat}$ to a step like analog signal. The LPF 35 removes frequency components of the clock signal $32_{clk}$ in the step like analog signal to make a sine wave analog signal and provides the sine wave analog signal to one input terminal of the phase comparator 36.

A PLL (phase lock loop) control loop is formed of the YTO 39, the divider 37, the phase comparator 36, and the integrator 38.

The phase comparator 36 detects phase differences between the two input signals and outputs signals showing the differences. Namely, the phase comparator 36 receives a reference phase signal from the DDS through the LPF 35 and oscillation signal $39_{osc}$ of the YTO 39, which is a voltage controlled oscillator, divided by 1/N at the divider 37. The phase comparator 36 provides pulse width signals which represent the phase differences between the two input signals to the integrator 38. The integrator 38 integrates the pulse width signals to produce an analog DC voltage which is proportional to the pulse width and supplies the analog voltage to an voltage control input of the YTO 39.

The YTO 39 is a variable resonance oscillator in a microwave frequency band using a YIG crystal. The YTO 39 receives the analog DC voltage from the integrator 38 and generates the step sweep frequency signal $39_{osc}$ which is phase locked by the PLL loop noted above. The signal $39_{osc}$ is supplied to the mixer 52 in the frequency converter 50 to frequency convert the input signal 100 to be measured to the intermediate frequency signal.

As in the foregoing, the sweep operation of the local oscillator 30 is made in the step manner. Therefore, as shown in FIG. 7(a), the frequency is also swept in the step like manner, and thus, the swept frequency varies discretely. As a result, dynamic spurious responses which is an inverse of the unit step time $T_{step}$, i.e., $\Delta f=1/T_{step}$ are induced as shown in FIG. 7(b). Because the spurious frequency $\Delta f$ is close to a center frequency $f_o$ of the input signal under measurement, it is difficult to remove this dynamic spurious by a filter circuit. Thus, the spurious will be displayed at the frequency positions of $f_o \pm \Delta f$.

Therefore, it is an object of the present invention to provide an improved local oscillator for use in a spectrum analyzer to sweep in a digital step manner which is capable of minimizing the dynamic spurious which is an inverse of the unit step time $T_{step}$.

DISCLOSURE OF THE INVENTION

FIG. 1 shows a first solution of the problem according to the present invention.

To solve the problem noted above, in the present invention, it is included in the spectrum analyzer a random clock delay 12 which provides a random clock $12_{rndclk}$ to the DDS 40. The random clock $12_{rndclk}$ is a clock where a time length of the unit step time $T_{step}$ for sweeping the local oscillator is modified to be random.

The random clock delay 12, by making the timing edges of the unit step time $T_{step}$ random, diffuses the dynamic spurious frequency $\Delta f=1/T_{step}$ generated by the local oscillator. Accordingly, the spectrum analyzer of this invention is considerably less affected by the dynamic spurious of the local oscillator which is swept by a digital step sweep through the DDS.

FIG. 3 shows a second solution of the problem according to the present invention.

To solve the problem noted above, in the present invention, a sweep step number control 22 is provided to increase the number of steps M in a sweep time $T_{sweep}$. Here, the sweep time $T_{sweep}$=(number of steps M)×(unit time step $T_{step}$). The sweep step number control 22 determines a division factor Div for dividing the reference clock signal so as to increase the step number M and provides the clock signal to the DDS time base 32. The sweep step number control 22 also provides advance phase data $22_{dat}$ corresponding to the increased step number M to the DDS 40.

By increasing the step number M with the use of the sweep step number control 22, and thus sweeping the local oscillator with smaller steps, the dynamic spurious will be reduced by a square of the step number M.

The dynamic spurious will be further reduced by combining the first and second solutions noted above.

The random clock delay 12 in the first embodiment generates the random step time which is about the same as the unit step time $T_{step}$. Consequently, the step sweep for the local oscillator operates randomly and thus the dynamic spurious frequency component $\Delta f=1/T_{step}$ is diffused. Therefore, the noise level caused by the dynamic spurious is significantly reduced.

The sweep step control 22 in the second embodiment increases the step number M to satisfy the relationship $T_{sweep}$=M×$T_{step}$ and provides the division factor Div corresponding to the increased step number M to the time base 32. The sweep step control 22 also provides the advanced phase data $22_{dat}$ to the DDS 40. Thus, the local oscillator is swept with smaller steps.

In this second embodiment, by increasing the step number M, the dynamic spurious is reduced by the square of the step number M.

As in the foregoing, according to the present invention, the improved local oscillator is achieved in which the dynamic spurious accompanied by the digital step sweep is considerably reduced.

BEST MODE FOR CARRYING OUT THE INVENTION

The first embodiment of the present invention will be explained with reference to the drawings.

In this embodiment of the present invention, dynamic spurious in a spectrum analyzer is reduced by modifying the unit step time $T_{step}$ for sweeping the local oscillator to be random and thus diffusing the spurious responses. This embodiment is explained with reference to FIGS. 1 and 2.

In the conventional technology, because the local oscillator is swept by using a fixed unit step time $T_{step}$, dynamic spurious frequency $\Delta f$ will be generated at fixed points of frequency as a relatively large noise level. In the present invention, this noise level is improved by diffusing the dynamic spurious.

Figure 1:
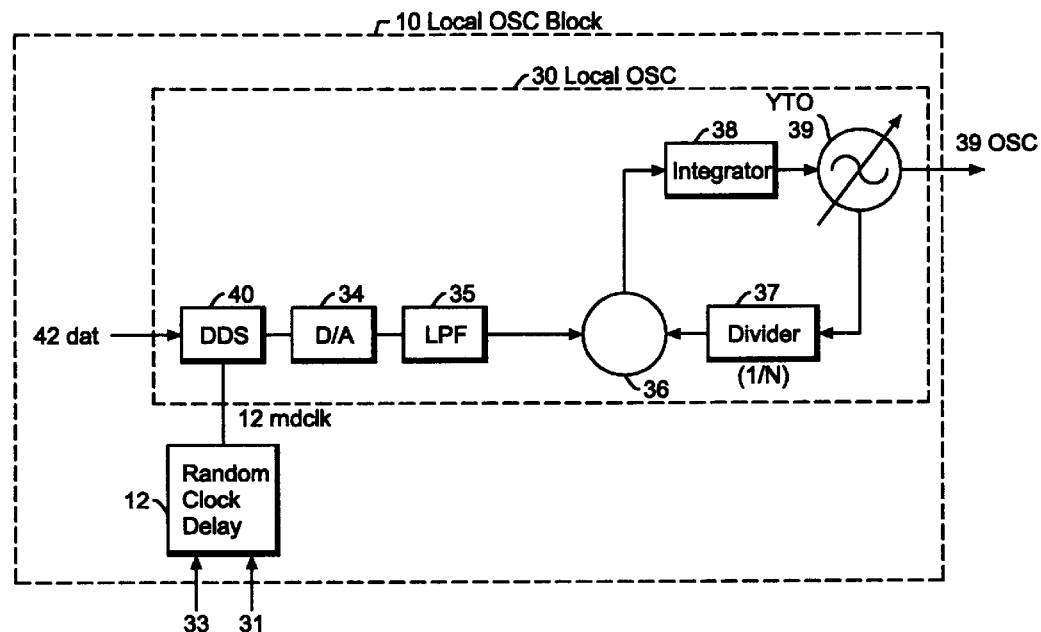
FIG. 1 is a block diagram showing a structure of local oscillator wherein a time length of a unit step time $T_{step}$ is controlled to be random according to the first embodiment of the present invention.

The local oscillator 10 of the present invention, as shown in FIG. 1, includes a random clock delay 12 instead of the DDS time base 32. Remaining structure of the local oscillator 30 is the same as the conventional one.

Figure 2:
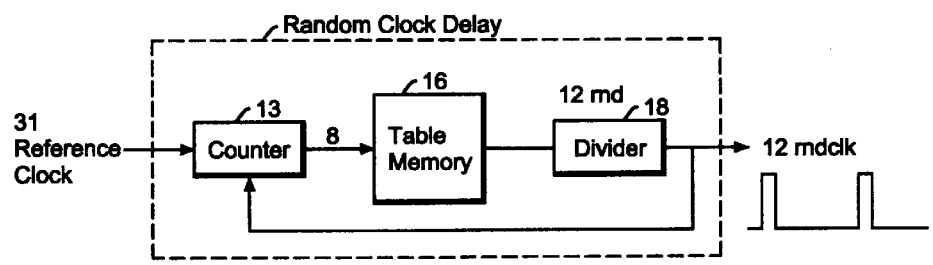
FIG. 2 is a block diagram showing a structure of a random clock delay 12 in the first embodiment of the present invention.

The random clock delay 12 generates, based on the sweep conditions 33, a random clock $12_{rndclk}$ having the unit time step $T_{step}$, and provides the random clock to the DDS 40. To do this, as shown in FIG. 2, the random clock delay 12 is formed of an address counter 13, a table memory 16 and a divider 18.

The address counter 13 is a 8-bit counter which increments by one in synchronism with a reference clock 31 every time it receives the random clock $12_{rndclk}$. The output of the address counter 13 is provided to the table memory 16 as the address signal.

The table memory 16 is a memory which stores pseudo-random data. The data stored in the table memory 16 is set in such a way that an average of the data in all of the addresses is a divisional factor Div as well as a random signal. By receiving the 8 bit address signal from the address counter 13, the table memory 16 generates random data $12_{rnd}$ which is provided to the divider 18.

The divider 18 receives the random data $12_{rnd}$ and divided it into a random clock signal $12_{rndclk}$ which has the unit step time $T_{step}$=$12_{rnd}$/(reference clock 31). The random clock signal $12_{rndclk}$ is provided to the DDS 40 and also to the address counter 13 as an count enable signal.

By repeating the above procedure, the step sweep for the local oscillator is modified to include the random times. As a result, the dynamic spurious frequency $\Delta f=1/T_{step}$ is diffused, which achieves a local oscillator of reduced dynamic spurious.

The second embodiment of the present invention is explained with reference to the drawings.

In this embodiment of the present invention, in controlling the DDS for sweeping the local oscillator, the step number M is increased and thus the unit step time becomes correspondingly short so that the local oscillator is swept with smaller steps. This embodiment is explained with reference to FIG. 3.

In the prior art technology, the step number M in the step sweep is a fixed number, such as 2,048, which forms one cycle of the step sweep. In other words, the fixed step number M is used all the time whether the sweep speed is high or low. When the sweep speed is high, since the dynamic spurious $\Delta f$ is sufficiently apart from the center frequency $f_o$ of the measuring signal, the spurious will not appear as a noise level on the display of the spectrum analyzer. However, when the sweep speed is low, since the dynamic spurious $\Delta f$ is close to the center frequency $f_o$ of the measuring signal, the spurious will appear as a noise level on the display of the spectrum analyzer. Therefore, in the present invention, in the DDS control of the local oscillator, the step number M is controlled so that the sweep time satisfies the relationship $T_{sweep}=M \times T_{step}$ to reduce the dynamic spurious.

The effect of the invention is numerically expressed as follows. Where a frequency range of a sweep is $S_{pan}$ and the number of step is $P_{oint}$ (same as M), a step frequency $\Delta f_{peak}$ is equal to $S_{pan}/P_{oint}$. A step frequency time $\Delta f_m$ is equal to $P_{oint}/T_{sweep}$. The dynamic spurious level S under this relationship is expressed as:

$$S[dB] = 20\log(\Delta f_{peak}/2 \times \Delta f_m)$$
$$= 20\log(S_{pan} \times T_{sweep}/2 \times P_{oint}^2)$$

By this expression, it is known that the dynamic spurious will be reduced by the square of $P_{oint}$ (step number M). For example, when the step number M is doubled, the dynamic spurious will be improved four times, i.e., 12dB.

Figure 3:
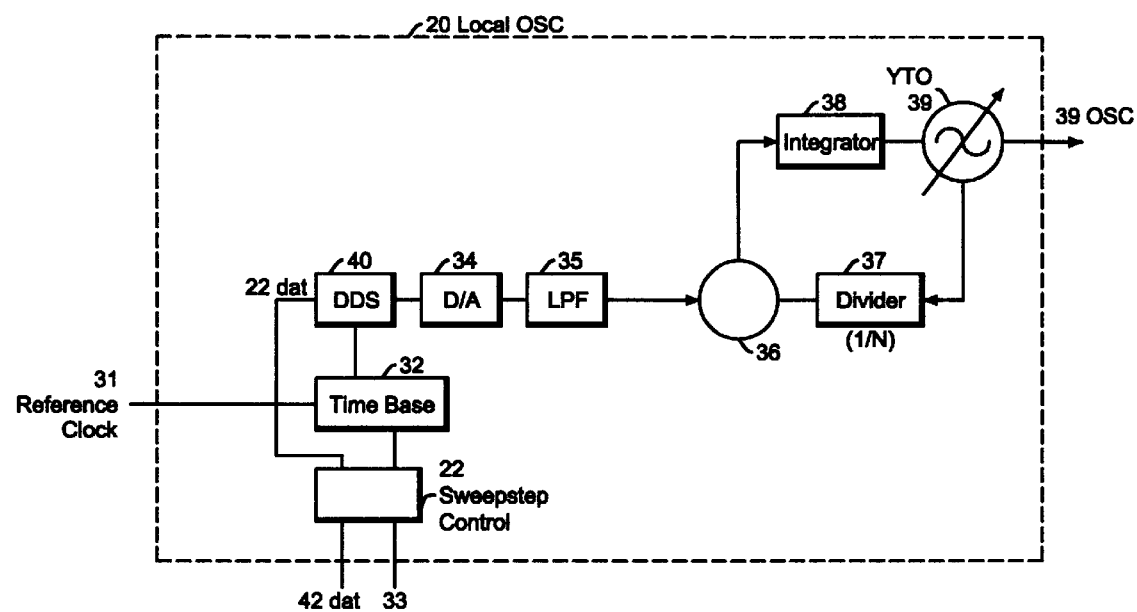
FIG. 3 is a block diagram showing a structure of local oscillator wherein the number of steps is increased so as to sweep the local oscillator with smaller steps according to the second embodiment of the present invention.
Figure 4:
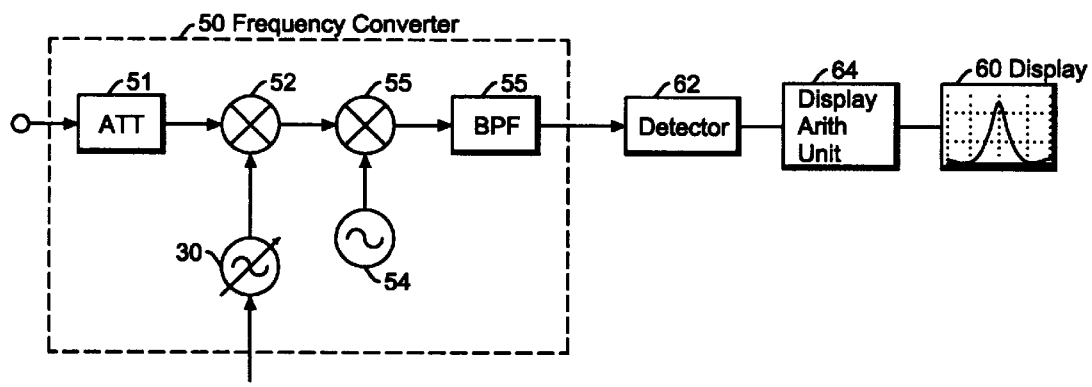
FIG. 4 block diagram showing a structure of spectrum analyzer using a conventional local oscillator which is swept by a digital step manner.
Figure 5:
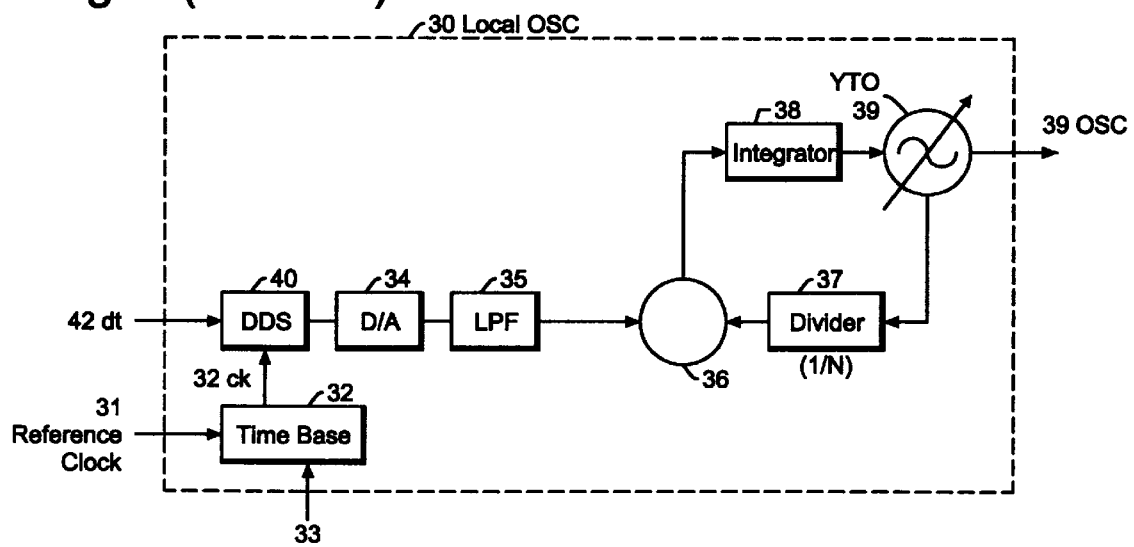
FIG. 5 shows a structure of a conventional local oscillator.
Figure 6:
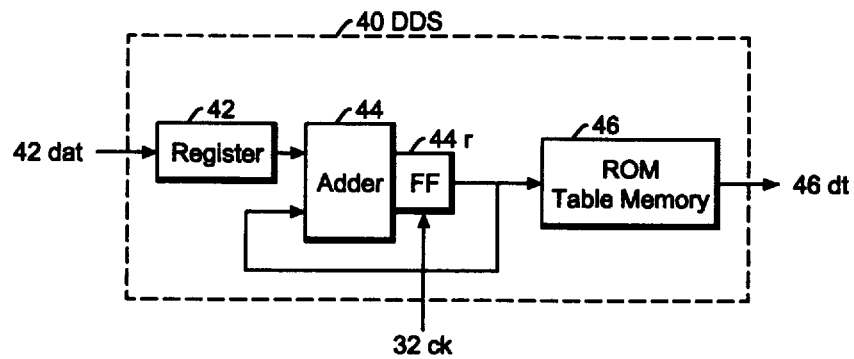
FIG. 6 shows a structure of DDS 40.
Figure 7A:
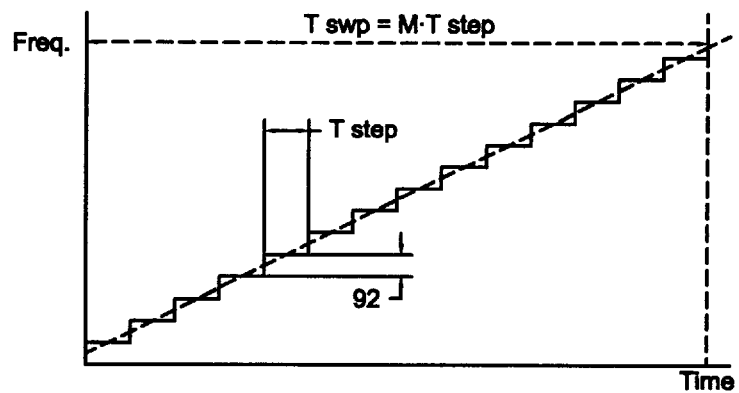
FIG. 7(a) is a schematic diagram showing a sweep wherein the frequency changes in a step manner.
Figure 7B:
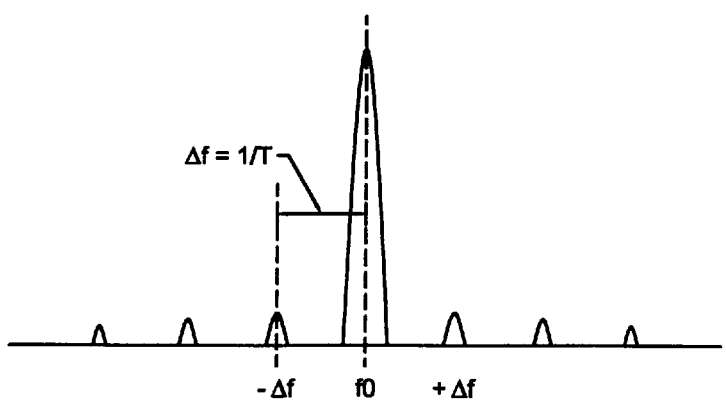
FIG. 7(b) is a schematic diagram showing dynamic spurious responses.

To do this, the local oscillator 20 in FIG. 3 includes a sweep step control 22. Remaining components in the local oscillator 20 are the same as in the conventional local oscillator.

The sweep step control 22, based on the advance phase data 42$_{dat}$ and the sweep condition 33, determines the maximum available step number M which satisfies $T_{sweep}=M \times T_{step}$ but within the operable range. The sweep step control 22 provides the division factor Div which satisfies this relationship to the time base 32. The sweep step control 22 also determines and provides the advanced phase data 22$_{dat}$ to the DDS. As an example, when M=2,048 and Div=100 in the conventional arrangement, by making Div=25 and M=8,192 in the present invention, the step number is increased four times. As a result, the dynamic spurious will be reduced by 24dB according to the above equation.

In the foregoing first embodiment, the random clock delay 12 is formed of the address counter 13, the table memory 16 and the divider 18. Other circuit arrangement is also possible such as using a PRBS (pseudo random binary sequence) which generates a maximum length sequence random signal.

Industrial Applicability

According to the present invention configured as in the foregoing has the following effects:

The random clock delay 12 in the first embodiment generates the random step time which is about the same as the unit step time $T_{step}$. Consequently, the step sweep for the local oscillator operates randomly and thus the dynamic spurious frequency component $\Delta f=1/T_{step}$ is diffused. Therefore, the noise level caused by the dynamic spurious is significantly reduced.

The sweep step control 22 in the second embodiment increases the step number M to satisfy the relationship $T_{sweep}=M \times T_{step}$ and provides the division factor Div corresponding to the step number M to the time base 32. The sweep step control 22 also provides the advance phase data 22$_{dat}$ to the DDS 40. Thus, the local oscillator is swept with smaller frequency steps.

In this second embodiment, by increasing the step number M, the dynamic spurious is reduced by the square of the step number M.

As in the foregoing, according to the present invention, the improved local oscillator is achieved in which the dynamic spurious accompanied by the digital step sweep is considerably reduced.

What is claimed is:

1. A spectrum analyzer for analyzing frequency spectrum of an incoming signal, comprising:

a local oscillator which is digitally swept by a DDS (direct digital synthesizer), said DDS generating a reference signal for said local -oscillator based on a sweep signal formed of a plurality of unit step time ($T_{step}$); and a random clock delay (12) for generating a random clock (12$_{rndclk}$) having a random step time whose average time is significantly the same as said unit step time ($T_{step}$) and providing said random clock to said DDS (40) so as to modulate said unit step time ($T_{step}$) by said random clock, said random clock delay (12) comprising:

an address counter for generating an address signal by counting a reference clock;

a table memory for storing random data for generating a pseudo random signal when accessed by said address signal from said address counter; and a divider for dividing said random signal from said table memory to form said random step time.

2. A spectrum analyzer as defined in claim 1, wherein said local oscillator further comprising:

a digital to analog converter for converting digital data from said DDS indicating said reference signal to an analog signal;

a filter for receiving said analog signal from said digital to analog converter and removing unwanted frequency components from said analog signal to form a reference sinusoidal signal; and a voltage controlled oscillator to be frequency mixed with said incoming signal to be analyzed by said frequency spectrum analyzer, a frequency of said voltage controlled oscillator being controlled by said reference sinusoidal signal by means of a phase lock loop.

3. A spectrum analyzer as defined in claim 1, further comprising:

a frequency converter for converting a frequency of an input signal to be measured to an intermediate frequency;

a band pass filter connected to said frequency converter and having a specified bandwidth for allowing an intermediate signal from said frequency converter having said intermediate frequency to pass therethrough;

a detector for receiving said intermediate signal from said band pass filter and detecting an amplitude thereof; and a display for displaying a detected signal from said detector in a frequency domain as frequency spectrum of said input signal.

4. A spectrum analyzer as defined in claim 1, wherein said random clock circuit receives said reference clock and produces said random clock which is supplied to said direct digital synthesizer.

5. A spectrum analyzer as defined in claim 3, wherein said voltage controlled oscillator is provided in said phase lock loop and said analog signal from said digital analog converter is provided to said phase lock loop as a reference frequency for said phase lock loop.

* * * * *